United States Patent
Eun et al.

(10) Patent No.: US 8,516,183 B2
(45) Date of Patent: Aug. 20, 2013

(54) METHOD OF ESTIMATING READ LEVEL FOR A MEMORY DEVICE, MEMORY CONTROLLER THEREFOR, AND RECORDING MEDIUM

(75) Inventors: Hee Seok Eun, Hwaseong-si (KR); Hong Rak Son, Anyang-si (KR); Jong Ha Kim, Seoul (KR); Young June Kim, Seoul (KR); Seong Hyeog Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 251 days.

(21) Appl. No.: 13/114,337

(22) Filed: May 24, 2011

(65) Prior Publication Data

US 2011/0289278 A1 Nov. 24, 2011

(30) Foreign Application Priority Data

May 24, 2010 (KR) ........................ 10-2010-0047886

(51) Int. Cl.
*G06F 12/00* (2006.01)
(52) U.S. Cl.
USPC ................. 711/103; 365/185.03; 365/185.33; 711/112; 711/165
(58) Field of Classification Search
USPC .................... 711/103, 112, 165; 365/185.03, 365/185.33
See application file for complete search history.

(56) References Cited

U.S. PATENT DOCUMENTS

| 6,532,556 | B1 * | 3/2003 | Wong et al. ................... 714/702 |
| 7,525,839 | B2 | 4/2009 | Shibata et al. |
| 7,889,563 | B2 * | 2/2011 | Cho et al. ................... 365/185.2 |
| 8,000,135 | B1 * | 8/2011 | Perlmutter et al. ...... 365/185.03 |
| 2008/0002452 | A1 | 1/2008 | Augustin et al. |
| 2008/0263266 | A1 | 10/2008 | Sharon et al. |
| 2009/0003073 | A1 | 1/2009 | Rizel et al. |

* cited by examiner

*Primary Examiner* — Hashem Farrokh
*Assistant Examiner* — Mohammed Haque
(74) *Attorney, Agent, or Firm* — Lee & Morse, P.C.

(57) ABSTRACT

A method of estimating a read level for a memory device includes calculating first information corresponding to at least one among information about the number of cells having a particular logic level in data to be programmed and information about the number of cells having a particular cell state and storing the first information during a program operation; reading the data based on a threshold level that has been set and calculating second information about the number of cells in at least one state defined by the threshold level with respect to the read data; calculating third information about the number of cells in the at least one state, which corresponds to the second information, using a probability based on the first information; comparing the second information with the third information; and determining whether to change the threshold level according to the comparison result.

20 Claims, 14 Drawing Sheets

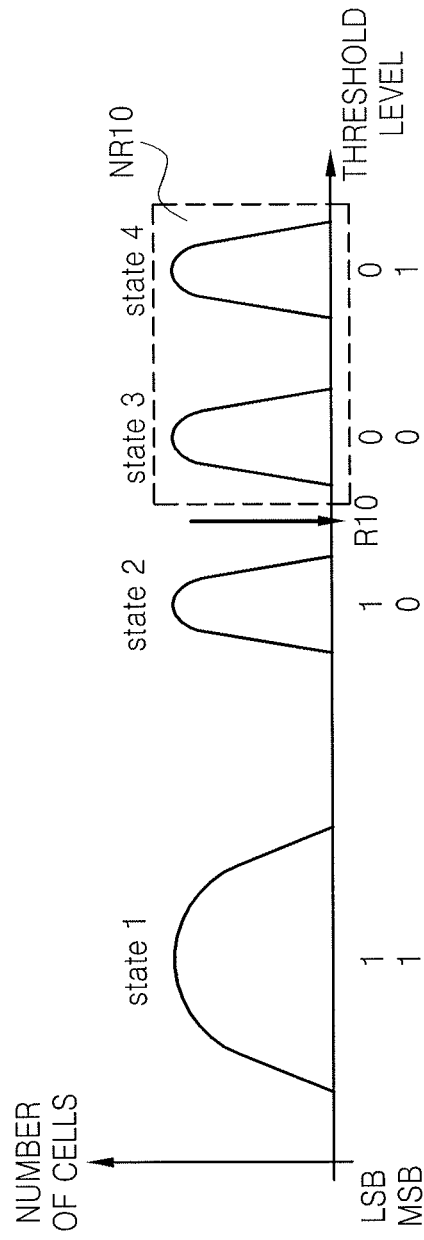

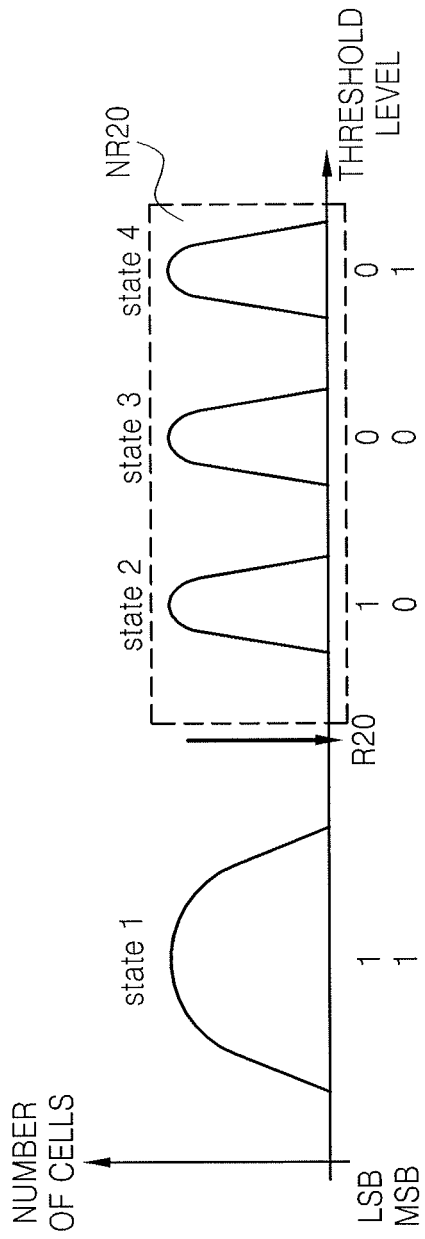

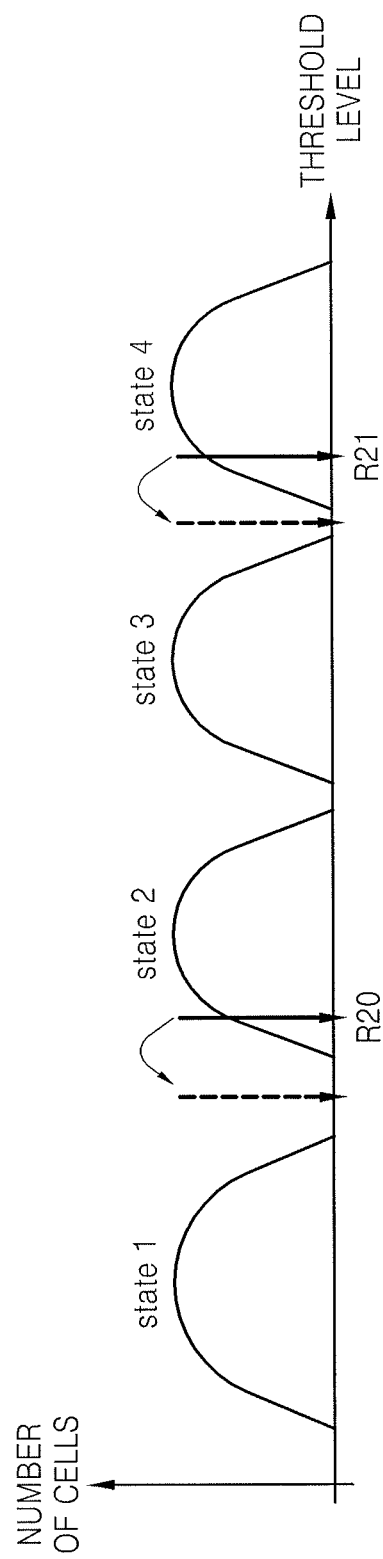

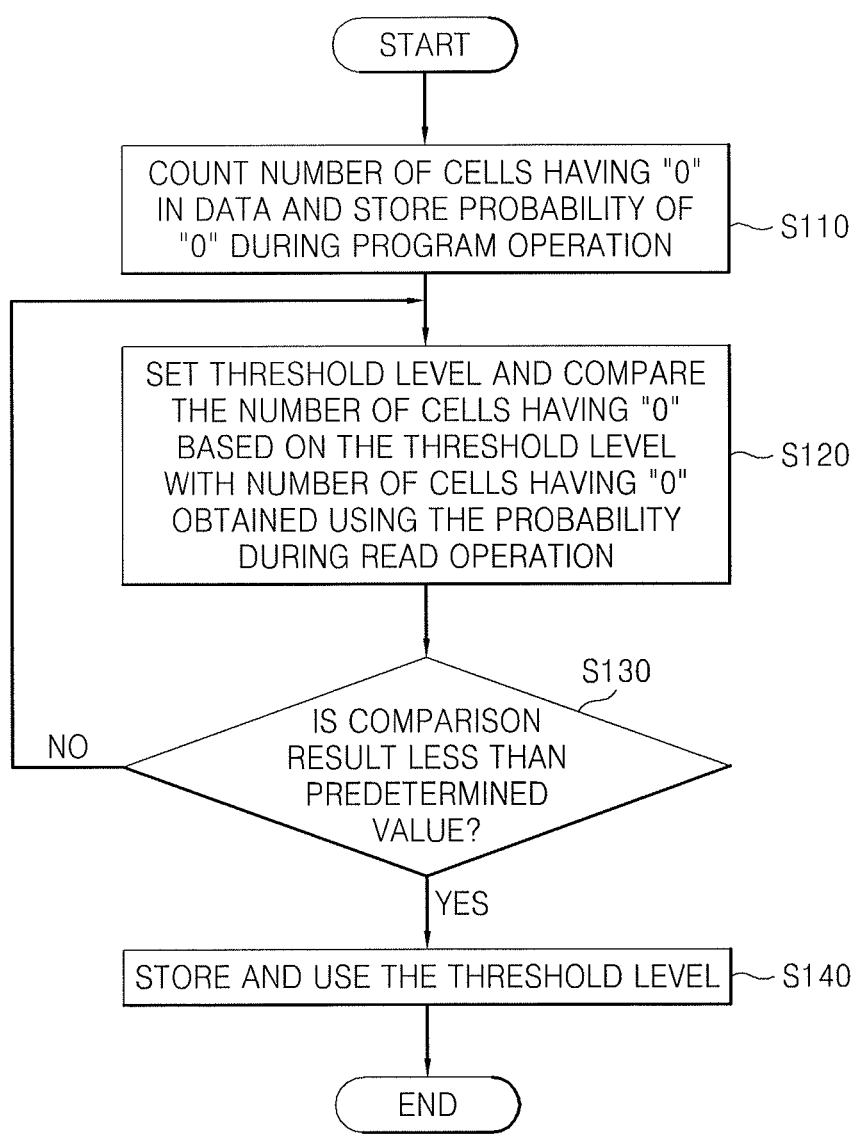

METHOD OF ESTIMATING READ LEVEL FOR A MEMORY DEVICE, MEMORY CONTROLLER THEREFOR, AND RECORDING MEDIUM

This U.S. non-provisional patent application claims priority under 35 U.S.C. §119(e) to Korean Patent Application No. 10-2010-0047886, filed on May 24, 2010, in the Korean Intellectual Property Office, the entire contents of which are incorporated by reference herein.

BACKGROUND

1. Field

Embodiments relate to a method and system for estimating a read level, a memory controller therefor, and a recording medium.

2. Description of the Related Art

There has been a lot of research into multi-level memory for storing multi-bit data in a single memory cell in order to increase the degree of integration in memory. Multiple bits, i.e., at least two bits can be stored in a memory cell of a multi-level memory device. Such memory cell that stores multiple bits is referred to as a multi-level cell (MLC) while a memory cell storing a single bit is referred to as a single-level cell (SLC). The threshold voltage distribution of a MLC changes over time due to coupling effect, charge loss, or the like. For this reason, it is desirable to relatively accurately estimate a read level in a non-volatile memory device in order to minimize a bit error rate (BER).

A variety of algorithms have been proposed for estimation of a read level. Algorithms aimed at decreasing a BER usually have a problem in that speed performance decreases due to the increase in the number of reads and data transfer in a memory device. When an algorithm is designed to minimize the decrease of the speed performance in order to overcome this problem, reliability may be decreased, increasing a BER. Therefore, a method of estimating a read level considering both a BER and speed performance is desired.

SUMMARY

Some embodiments provide a method of estimating a read level using a probability with consideration to a bit error rate (BER) and speed performance, memory controller therefor, and recording medium.

Some embodiments provide a method of estimating a read level for a memory device. The method may include calculating first information corresponding to at least one of information about a number of cells having a particular logic level in data to be programmed and information about a number of cells having a particular cell state and storing the first information during a program operation; reading the data based on a threshold level that has been set and calculating second information about a number of cells in at least one state defined by the threshold level with respect to the read data; calculating third information about a number of cells in the at least one state using a probability based on the first information; comparing the second information with the third information; and determining whether to change the threshold level according to the comparison result.

The particular cell state may include at least state one among states in which a multi-level cell storing multiple bits can be. The first information may be the number of multi-level cells in which a particular bit between a least significant bit and a most significant bit has a first logic level. The second information may be the number of multi-level cells in the particular cell state. The third information may be the number of multi-level cells in the particular cell state calculated using the probablity.

The first information may be stored in a spare area of the memory device or a buffer within a memory controller.

The operation of determining whether to change the threshold level may include determining whether to change the threshold level according to a difference between the second information and the third information obtained as the comparison result.

The method may further include maintaining the threshold level when the difference between the second information and the third information is less than a predetermined value; and setting a new threshold level and repeating the operation of reading the data and calculating the second information through the operation of comparing the second information and the third information when the difference between the second information and the third information exceeds the predetermined value.

Some embodiments provide a memory controller for controlling a memory device. The memory controller may include a control module configured to set a threshold level and control the memory device; an information calculator configured to be connected with the control module, to calculate first information corresponding to at least one among information about the number of cells having a particular logic level in data to be programmed to the memory device and information about the number of cells having a particular cell state, to calculate second information about the number of cells in at least one state defined by the threshold level with respect to data read based on the threshold level, and to estimate third information about the number of cells in the at least one state, which corresponds to the second information, using a probability based on the first information; and a comparator configured to be connected with the control module and the information calculator and to compare the second information with the third information.

The control module may determine whether to change the threshold level according to a difference between the second information and the third information obtained as a comparison result of the comparator.

The memory controller may further include a buffer configured to store the first information.

The control module may change the threshold level and reset a new threshold level when the difference between the second information and the third information exceeds a predetermined value.

The control module may store the threshold level in the buffer when the difference between the second information and the third information is less than a predetermined value.

The control module may compare a gap between a previous threshold level with a current threshold level with a reference value when the difference between the second information and the third information is less than a predetermined value.

The control module may use the previous threshold level when the gap between the previous threshold level and the current threshold level is greater than the reference value and may store and use the current threshold level when the gap is less than the reference value.

Some embodiments provide a memory system including a memory device and any of the above-described memory controllers.

The memory device may include a spare area configured to store the first information.

The memory controller may store the threshold level in the spare area when the difference between the second information and the third information is less than a predetermined value.

Some embodiments provide a method of estimating a read level for a memory device. The method may include calculating a first number of cells to be programmed with a particular subset of data in cells in the memory device, storing the first number of cells during a program operation, reading the data based on a threshold level that has been set, calculating a second number of cells in at least one state defined by the threshold level with respect to the read data, calculating a third number of cells in the at least one state using a probability based on the first number of cells, comparing the second number of cells with the third number of cells, and determining whether to change the threshold level according to a comparison result.

BRIEF DESCRIPTION OF THE DRAWINGS

The above and other features and advantages will become more apparent to those of ordinary skill in the art by describing in detail exemplary embodiments with reference to the attached drawings, in which:

FIGS. 2A through 2C illustrate diagrams for explaining a method of estimating a read level according to some embodiments;

FIGS. 3A and 3B illustrate diagram for explaining a method of estimating a read level according to other embodiments;

FIG. 5A illustrates a flowchart of a method of estimating a read level according to further embodiments;

DETAILED DESCRIPTION

Figure 1A:
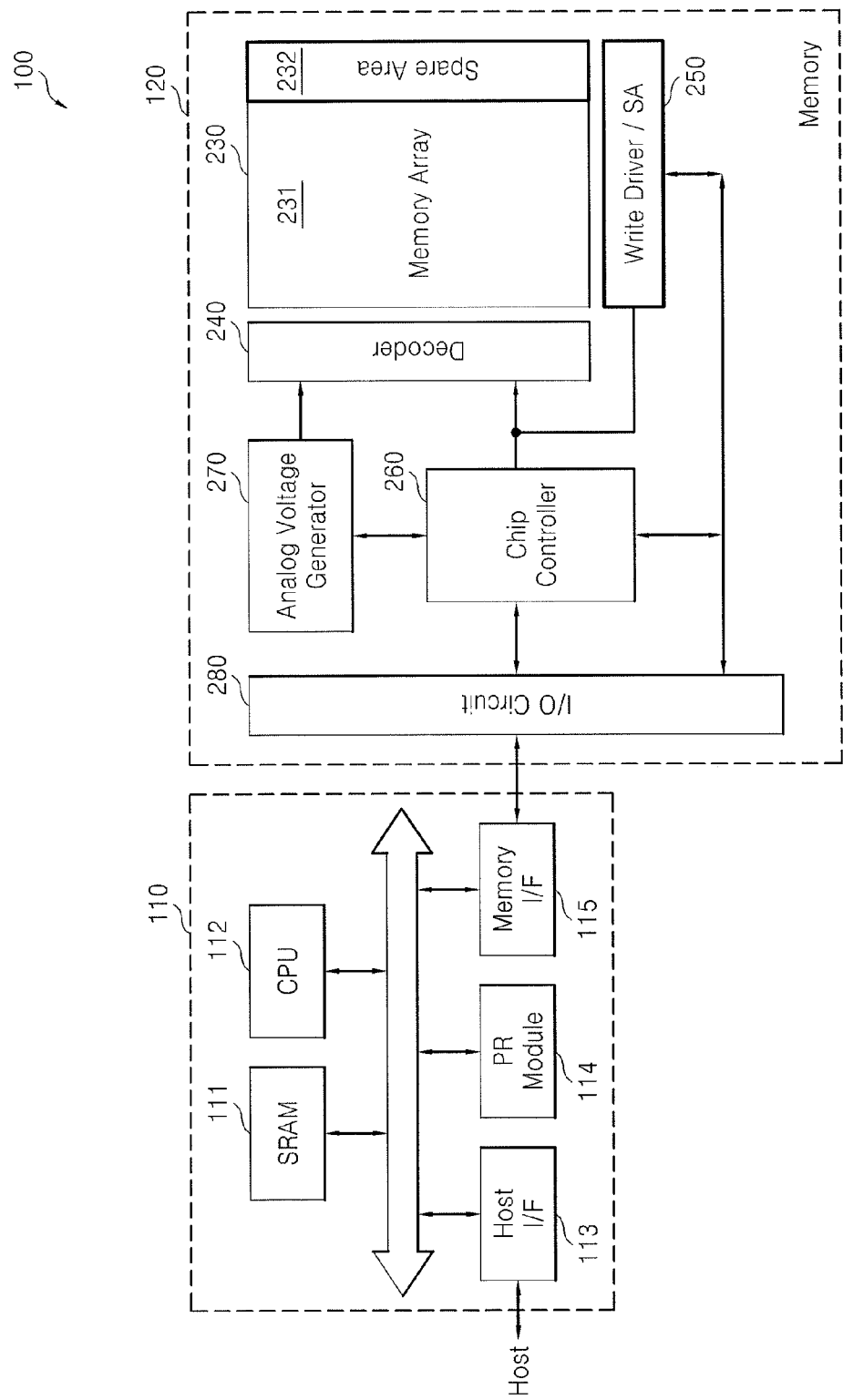
FIG. 1A illustrates a block diagram of a non-volatile memory system according to some embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1A illustrates a block diagram of a non-volatile memory system 100 according to some embodiments. The non-volatile memory system 100 includes a non-volatile memory device 120 and a memory controller 110 controlling the non-volatile memory device 120.

The non-volatile memory device 120 may include a memory cell array 230, a decoder 240, a write driver/sense amplifier (SA) circuit 250, a chip controller 260, an analog voltage generator 270, and an input/output (I/O) circuit 280. The memory controller 110 may include a static random access memory (SRAM) 111, a central processing unit (CPU) 112, a host interface (I/F) 113, a program/read (PR) module 114, and a memory I/F 115. Since those of ordinary skill in the art will be readily understand the functions of the SRAM 111, the CPU 112, the host I/F 113, and the memory I/F 115, descriptions thereof will be omitted. The PR module 114 will be described in detail with reference to FIG. 1B later.

The memory cell array 230 includes a main area 231 and a spare area 232. The main area may be used to store user data and is thus referred to as a user data area. The spare area 232 may be used to store error correcting code (ECC) information and a probability of the number of bits (or cells) of "0" or "1" in data to be programmed, which are counted by the PR module 114.

The decoder 240 may select a word line from among a plurality of word lines in response to a row address, provide a first operating voltage to the selected word line, and provide a second operating voltage to unselected word lines. For instance, in a program mode, the decoder 240 may provide the first operating voltage (e.g., a program voltage) to the selected word line and the second operating voltage (e.g., a pass voltage) to the unselected word lines. Further, in a read mode, the decoder 240 may provide the first operating voltage (e.g., a ground voltage) to the selected word line and the second operating voltage (e.g., a read voltage) to the un-selected word lines.

The write driver/SA circuit 250 is selectively connected with a plurality of bit lines and writes (or programs) data to selected memory cells or reads data by sensing and amplifying the data from the selected memory cells. The write driver/SA circuit 250 may include a plurality of data storage units (not shown) to store a data set to be programmed in a program operation and to store a data set that has been read from memory cells in a read operation. Each of the data storage units may be implemented by a latch. The data storage units may also store a data set that has been read in a program verify operation.

A switching block (not shown) may also be provided between the write driver/SA circuit 250 and the memory cell array 230 to selectively connect the write driver or the SA with the bit lines.

The chip controller 260 outputs internal control signals (not shown) for controlling the operations (e.g., program operation, erase operation, and read operation) of the non-volatile memory device 120 in response to an external command. The analog voltage generator 270 generates voltages, e.g., a program voltage, a pass voltage, and a read voltage, necessary for the operation of the non-volatile memory device 120.

The I/O circuit 280 interfaces with an external device (e.g., the memory controller 110). In detail, the I/O circuit 280 may receive a command and data to be programmed from the external device, and may transmit a status signal and data that has been read to the external device.

The memory controller 110 controls data exchange between a host and the non-volatile memory device 120. For instance, the memory controller 110 controls the non-volatile memory device 120 to write or read data in compliance with the host.

It has been stated above that the probability of a bit of "0" or "1" is stored in the spare area 232, but embodiments are not limited thereto. For instance, the number of bits (or cells) of "0" or "1", which is used to calculate the probability, may be stored.

Figure 1B:
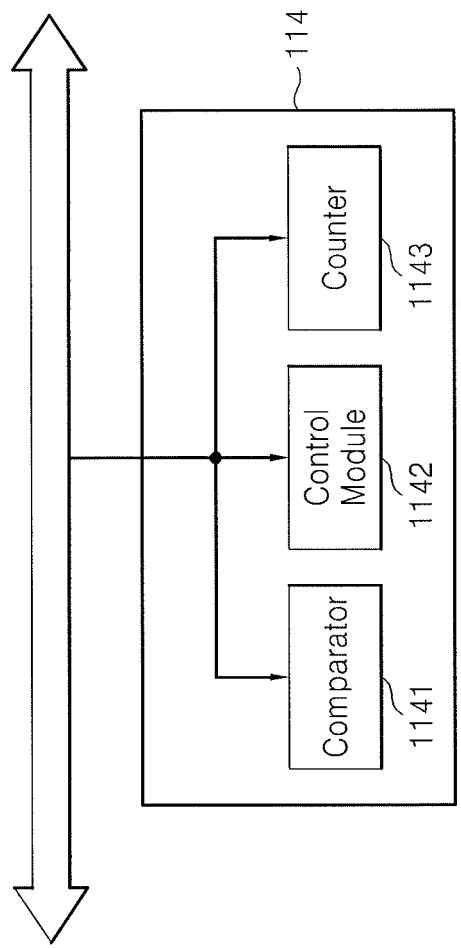
FIG. 1B illustrates a diagram of a program/read (PR) module illustrated in FIG. 1A.

FIG. 1B is a diagram of the PR module 114 illustrated in FIG. 1A. Referring to FIG. 1B, the PR module 114 includes a comparator 1141, a control module 1142, and an information calculator. The information calculator may be implemented by a counter 1143 which counts bits of "0" or "1" in data to be programmed in the program operation of the non-volatile memory device 120, but embodiments are not limited thereto. For instance, the data to be programmed may be divided into pages and the number of cells having a logic level of "0" (i.e., the number of 0s) or the number of cells having a logic level of "1" (i.e. the number of 1s) may be counted in each page.

The information calculator may store the number of cells or bits or the probability of the number of cells in the spare area 232 or a buffer (not shown) within the memory controller 110 or the PR module 114. For instance, when the PR module 114 calculates the probability of a bit of "0" and the number of cells having a least significant bit (LSB) of "0" is represented with N10, a probability of an LSB of "0" is $$\frac{N10}{N}$$

where N is the sum of the number of cells having bits of "0" and the number of cells having bits of "1". Accordingly, the probability of an LSB of "1" is calculated by $$1 - \frac{N10}{N}.$$

In the same manner, when the number of cells having a most significant bit (MSB) of "0" is represented with N20, a probability of an MSB of "0" is $$\frac{N20}{N}$$

where N is the sum of the number of cells having bits of "0" and the number of cells having bits of "1". Accordingly, the probability of an MSB of "1" is calculated by $$1 - \frac{N20}{N}.$$

The comparator 1141 is connected with the control module 1142 and the counter 1143. When the control module 1142 controls a read operation, the comparator 1141 may compare the probability of the number of cells obtained during a program operation with a probability of a bit of "0" or "1" based on a threshold level, e.g., a threshold voltage, of the read operation or compare the number of cells having a bit of "0" or "1" based on the probability of the number of cells obtained during the program operation with the number of cells based on the probability of a bit of "0" or "1" based on the threshold level of the read operation so that a read level can be accurately estimated. This will be described in detail with reference to FIGS. 2A through 2C later.

The control module 1142 controls the program operation and the read operation of the non-volatile memory device 120 and controls the counter 1143 to count bits of "0" or "1" in data to be programmed in the program operation. In the read operation, the control module 1142 sets a threshold level, e.g., a threshold voltage, of the read operation. When a difference obtained as a result of comparison by the comparator 1141 is greater than a predetermined value, the control module 1142 newly sets the threshold level so that the comparator 1141 performs comparison using the newly set threshold level.

The control module 1142 may also control the number of cells in each state, i.e., to be counted using all page data. Here, the number of cells in each state may be referred to as a state count. Each memory cell is determined to be in one of four states depending on whether the LSB and the MSB stored or to be stored in the memory cell is "0" or "1". Accordingly, a "state" or a "cell state" may indicate a combination of bits (i.e., at least two bits) stored in a single multi-level memory cell. For instance, the combination "11" of the MSB and the LSB may be referred to as an erased state or "E"; "01" may be referred to as a first programmed state or "P1"; "00" may be referred to as a second programmed state or "P2"; and "10" may be referred to as a third programmed state or "P3". However, embodiments are not limited thereto. For example, the definition of states corresponding to the combinations of MSB and LSB may be changed. At this time, the counter 1143 counts cells in each one of the four states, i.e., "11", "01", "10", and "00" in all page data and the comparator 1141 performs comparison using the state counts.

The comparator 1141 and the counter 1143 are provided within the PR module 114 inside the memory controller 110 in the current embodiments, but embodiments are not limited thereto. For instance, the comparator 1141 and the counter 1143 may be provided within the non-volatile memory device 120.

Figure 2C:
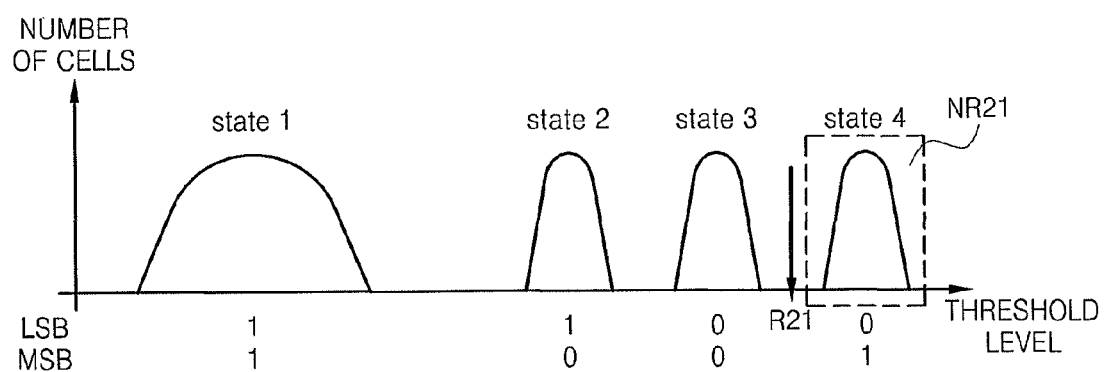

FIGS. 2A through 2C are diagrams for explaining a method of estimating a read level according to some embodiments. The method may be performed by the memory controller 110 illustrated in FIGS. 1A and 1B.

Hereinafter, "first information" is information regarding the number of cells having a bit of "0" in data to be programmed in the program operation or about the number of cells having a particular cell state. "Second information" is information regarding the number of cells in at least one of first through fourth states defined based on a threshold level. "Third information" is information regarding the number of cells in the at least one state using a value calculated from a probability obtained from the first information. In other words, the third information is a value corresponding to the second information, but is calculated from the probability obtained using the first information.

The method illustrated in FIGS. 2A through 2C will be explained based on program and read operations on a 2-bit multi-level cell (MLC). As described above, the counter 1143 counts the number (i.e., the first information) of cells having the bit of "0" in the data to be programmed during the program operation of the non-volatile memory device 120 and a probability of the number of cells is stored in the spare area 232. Alternatively, the number of cells having the bit of "0" in the data to be programmed may be calculated by the information calculator and stored in the spare area 232.

When the probability of the number of cells having the bit of "0" in the data to be programmed is calculated, the number of LSBs of "0" is N10, a probability of an LSB of "0" is $$\frac{N10}{N},$$

a probability of an LSB of "1" is $$1 - \frac{N10}{N},$$

the number of MSBs of "0" is N20, a probability of an MSB of "0" is $$\frac{N20}{N},$$

and a probability of an MSB of "1" is $$1 - \frac{N20}{N}.$$

The spare area 232 may store the probabilities of a bit of "0", i.e., $$\frac{N10}{N} \text{ and } \frac{N20}{N}$$

or may store all of the probabilities, i.e., $$\frac{N10}{N}, 1 - \frac{N10}{N}, \frac{N20}{N}, \text{ and } 1 - \frac{N20}{N}.$$

Referring to FIG. 2A, during the read operation of the non-volatile memory device 120, the number (i.e., the second information or NR10) of cells having an LSB of "0" among LSBs read based on a threshold level R10 set by the PR module 114 of the memory controller 110 is compared with the number (i.e., the third information) of cells having the LSB of "0" obtained using the probability of the LSB of "0" stored in the spare area 232 using the comparator 1141. Alternatively, comparison may be performed with respect to the number of 1s instead of the number of 0s. Here, the threshold level R10 is used to distinguish the first and second states, i.e., State 1 and State 2 in which the LSB is "1," from the third and fourth states, i.e., State 3 and State 4 in which the LSB is "0".

When a result of the comparison is out of a predetermined range, the threshold level R10 is newly set and the comparison is performed again. When the result of the comparison is within the predetermined range, comparison with respect to the MSB is performed. However, embodiments are not limited thereto. For instance, resetting of the threshold level R10 and a comparison process may be repeatedly performed until the sign, e.g., "+" or "−", of a comparison result changes and the threshold level R10 may be determined using the absolute difference between a comparison result obtained when the sign changes and a comparison result obtained immediately before the sign changes.

Referring to FIGS. 2B and 2C, comparison with respect to the MSB may be performed in the same manner as described with reference to FIG. 2A based on threshold levels R20 and R21. With respect to the MSB, it is necessary to set the threshold levels R20 and R21 to distinguish the first and fourth states, i.e., State 1 and State 4 indicating "1" from the second and third states, i.e., State 2 and State 3 indicating "0".

Referring to FIG. 2B, the number (i.e., the second information or NR20) of cells in any one of the second through fourth states, i.e., State 2 through State 4, distinguished by the threshold level R20 from the first state, i.e., State 1, may be compared by the comparator 1141 with the sum of the numbers (i.e., the third information) of cells having a bit of "0" in the respective four states, i.e., State 1 through State 4 obtained based on the probabilities of the bit of "0" stored in the spare area 232.

The sum of the numbers (i.e., the third information) of cells having the bit of "0" in the respective second through fourth states, i.e., State 2 through State 4, which are obtained based on the probabilities of the bit of "0" stored in the spare area 232, may be obtained by adding the number (i.e., $$\frac{N10}{N} * N)$$

of cells in either of the third and fourth states, i.e., State 3 and State 4 in which the LSB is "0," to the number of cells in the second state, i.e., State 2. The number of cells in the second state, i.e., State 2, is obtained by calculating the number (i.e., $$\left(1 - \frac{N10}{N}\right) * \frac{N20}{N} * N)$$

of cells having the LSB of "1" and the MSB of "0".

Referring to FIG. 2C, the number (i.e., the second information or N21) of cells in the fourth state, i.e., State 4, defined by the threshold level R21 may be compared by the comparator 1141 with the number (i.e., the third information) of cells in the fourth state, i.e., State 4, which is obtained based on the probabilities of the bit of "0" that are stored in the spare area 232. The number of cells having the bit of "0" in the fourth state, i.e., State 4, based on the probabilities of the bit of "0" stored in the spare area 232 may be obtained by calculating the number (i.e., $$\frac{N10}{N} * \left(1 - \frac{N20}{N}\right) * N\right)$$

of cells having the LSB of "0" and the MSB of "1".

A value obtained from an equation calculating the number of cells in each state to find the MSB threshold levels R20 and R21 is a stochastically estimated value and may be different from the actual number of cells in each state. However, all data of an LSB/MSB page needs to be known before the program operation in order to get the exact number of cells in each state, which could be problematic in terms of programming methods and speed performance. To overcome the problem of decreasing speed performance, embodiments are directed to a method of estimating a threshold level for each page without examining all data of the page. According to the present embodiments, loss in reliability is reduced as a difference between the stochastically estimated value and an actual value decreases when the data size (i.e., N) of an entire page increases.

The comparisons of the numbers (i.e., the second information and the third information) of cells described with reference to FIGS. 2A through 2C can be expressed by Formulas 1 through 3:

$$NR10 - \left(\frac{N10}{N} * N\right) \leq OFF1, \quad (1)$$

$$NR20 - \left(\frac{N10}{N} * N + \left(1 - \frac{N10}{N}\right) * \frac{N20}{N} * N\right) \leq OFF2, \text{ and} \quad (2)$$

$$NR21 - \left(\frac{N10}{N} * \left(1 - \frac{N20}{N}\right) * N\right) \leq OFF3, \quad (3)$$

where NR10 is the number of cells in either of the third and fourth states based on a first threshold level R10, N20 is the number of cells in any one of the second through fourth states based on a second threshold level R20, NR21 is the number of cells in the fourth state based on a third threshold level R21, N is the total number of cells, OFF1 through OFF3 are predetermined values, N10 is the number of cells having the LSB of "0", and N20 is the number of cells having the MSB of "0".

Figure 3A:
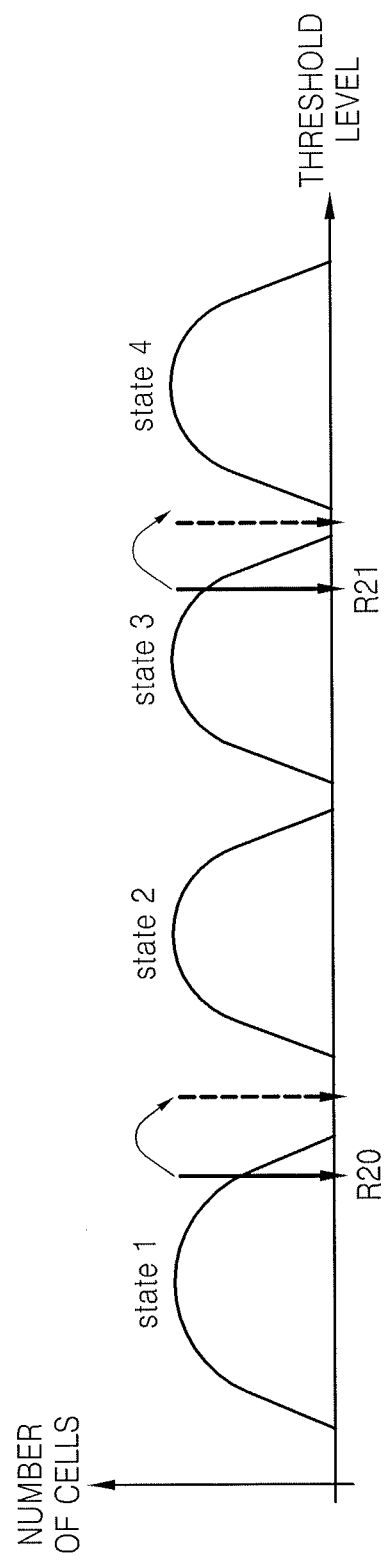

FIGS. 3A and 3B are diagram for explaining a method of estimating a read level according to other embodiments. The method illustrated in FIGS. 3A and 3B is based on the method illustrated in FIGS. 2A through 2C. The method illustrated in FIGS. 3A and 3B may be used in the read operation of an MLC storing at least two bits, but embodiments are not limited thereto.

As described above, there may be an error between the number of cells in each state based on a read level, which is obtained using probability according to some embodiments, and the actual number of cells in the state. Below, the actual numbers of cells in the respective first through fourth states, i.e., State 1 through State 4, are represented with N1, N2, N3, and N4, respectively, and errors are represented with E1, E2, E3, and E4, respectively. At this time, the numbers of cells in the respective states based on the read level, which are obtained using the probability, are respectively represented with N1+E1, N2+E2, N3+E3, and N4+E4 and can be respectively expressed by Formulas 4 through 7:

$$C1 = N1 + E1, \quad (4)$$

$$C2 = N2 + E2 = \left(1 - \frac{N10}{N}\right) * \frac{N20}{N} * N = N20 - \frac{N10 * N20}{N}, \quad (5)$$

$$C3 = N3 + E3 = \left(\frac{N10}{N}\right) * \frac{N20}{N} * N, \text{ and} \quad (6)$$

$$C4 = N4 + E4 = \left(\frac{N10}{N}\right) * \left(1 - \frac{N20}{N}\right) * N = N10 - \frac{N10 * N20}{N}, \quad (7)$$

where C1 through C4 are the numbers of cells in the respective first through fourth states, i.e., State 1 through State 4 based on the read level, which are obtained using at least one probability described in the above embodiments, respectively; N1 through N4 are the actual numbers of cells in the respective first through fourth states, i.e., State 1 through State 4, respectively; E1 through E4 are errors with respect to the first through fourth states, i.e., State 1 through State 4, respectively; and N, N10, and N20 are the same as those in Formulas 1 through 3.

Since N20 is the same as the sum of the number of cells in the second state, i.e., State 2 and the number of cells in the third state, i.e., State 3, N20=N2+N3, and E2=−E3 is established through $$N20 = N2 + N3 = N20 - \frac{N10 * N20}{N} - E2 + \frac{N10 * N20}{N} - E3.$$

In addition, since N10 is the same as the sum of the number of cells in the third state, i.e., State 3 and the number of cells in the fourth state, i.e., State 4, N10=N3+N4, and −E3=E4 is established through $$N10 = N3 + N4 = \frac{N10 * N20}{N} - E3 + N10 - \frac{N10 * N20}{N} - E4.$$

In the same manner, E1=−E2 is established.

Accordingly, when the number of cells in the first state, i.e., State 1 is estimated to be N1+a1, the number of cells in the second state, i.e., State 2, is estimated to be N2−a1, the number of cells in the third state, i.e., State 3, is estimated to be N3+a1, and the number of cells in the fourth state, i.e., State 4, is estimated to be N4−a1. Consequently, when an MLC stores two bits, the read level can be more efficiently estimated. The description has been made based on a 2-bit MLC, but a similar effect can be achieved with respect to MLC storing more than two bits.

Based on the above-described tendencies, FIG. 3A shows a case where the threshold level R20 is estimated at a value smaller than an actual value and the threshold level 20 may be shifted to the right to correct the estimation. Here, the threshold level R21 may also be shifted to the right according to the tendencies. FIG. 3B shows a case where the threshold level R20 is estimated at a value greater than an actual value and the threshold level 20 may be shifted to the left to correct the estimation. Here, the threshold level R21 may also be shifted to the left according to the tendencies.

When a gap between a previous read level and a current read level is greater than a predetermined value, that is, when there is more shift than expected in the read level, the previous threshold level may be used in a read operation. At this time, the previous threshold level may have been estimated and stored in the spare area 232 or a buffer (not shown) within the memory controller 110 or the PR module 114.

Figure 4:
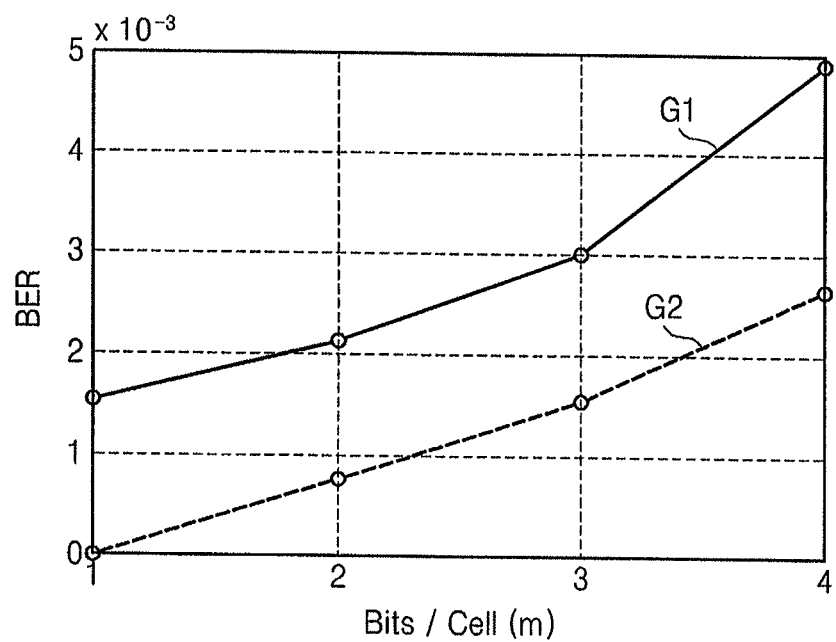
FIG. 4 illustrates a graph showing bit error rates in the simulations of a method of estimating a read level according to an embodiment and a comparative method.

FIG. 4 is a graph showing bit error rates (BERs) in the simulations of a method of estimating a read level according to the present embodiment (hereinafter, referred to as a proposed method) and a comparative example (hereinafter, referred to as a first method). The first method presumes that the numbers of cells in respective states are the same considering randomizer technology used to secure reliability.

A BER may be used as a numerical value indicating how often or how many errors occur in a memory device. The BER is originally the number of bit errors divided by the total number of transferred bits during communication. The BER may also be used as an index indicating the number of cells having errors divided by the total number of cells in memory devices. Accordingly, a decrease in BER means that the number of cells having errors has decreased.

The BER is used as a numerical value for measuring a read error occurring in a memory device in the current embodiments, but embodiments are not limited thereto. For example, any numerical values, expressions and formulas indicating how often or many errors occur may be used.

Referring to FIG. 4, a BER graph G1 resulting from the first method is above a BER graph G2 resulting from the proposed method according to some embodiments. In other words, the proposed method has a lower BER than the first method. When the proposed method is compared with a method (hereinafter, referred to as a second method) of estimating a read level based on the actual number of cells in each state, the proposed method provides higher speed performance since only the number of cells having "0" is counted. Accordingly, the proposed method minimizes a BER with respect to the first (faster) method, while improving speed with respect to the second (more precise) method.

Alternatively, the memory controller 110 may used a combination of the proposed method, the first method, and the second method to estimate a read level.

FIG. 5A illustrates a flowchart of a method of estimating a read level according to further embodiments. The method illustrated in FIG. 5A may be performed by the non-volatile memory system 100 illustrated in FIGS. 1A and 1B.

Referring to FIG. 5A, during a program operation of the non-volatile memory device 120, the counter 1143 counts the number of cells having a bit of "0" in data to be programmed and stores a probability of the bit of "0" in the spare area 232 or a buffer (not shown) within the memory controller 110 in operation S110. Alternatively, the counter 1143 may count the number of cells having a bit of "1" instead of the number of cells having the bit of "0" and the number of cells instead of the probability may be stored.

Thereafter, during the read operation of the non-volatile memory device 120, a threshold level is set and the number of cells having the bit of "0" based on the threshold level is compared with the number of cells obtained using the probability of the bit of "0" stored in the spare area 232 using the comparator 1141 in operation S120. When a comparison result is determined to be less than a predetermined value in operation S130, the read operation is performed based on the threshold level in operation S140. The threshold level may be stored in the spare area 232 or the buffer within the memory controller 110. When the comparison result is determined to exceed or equal the predetermined value in operation S130, the method goes back to operation S120 in which a new threshold level is set.

Figure 5B:
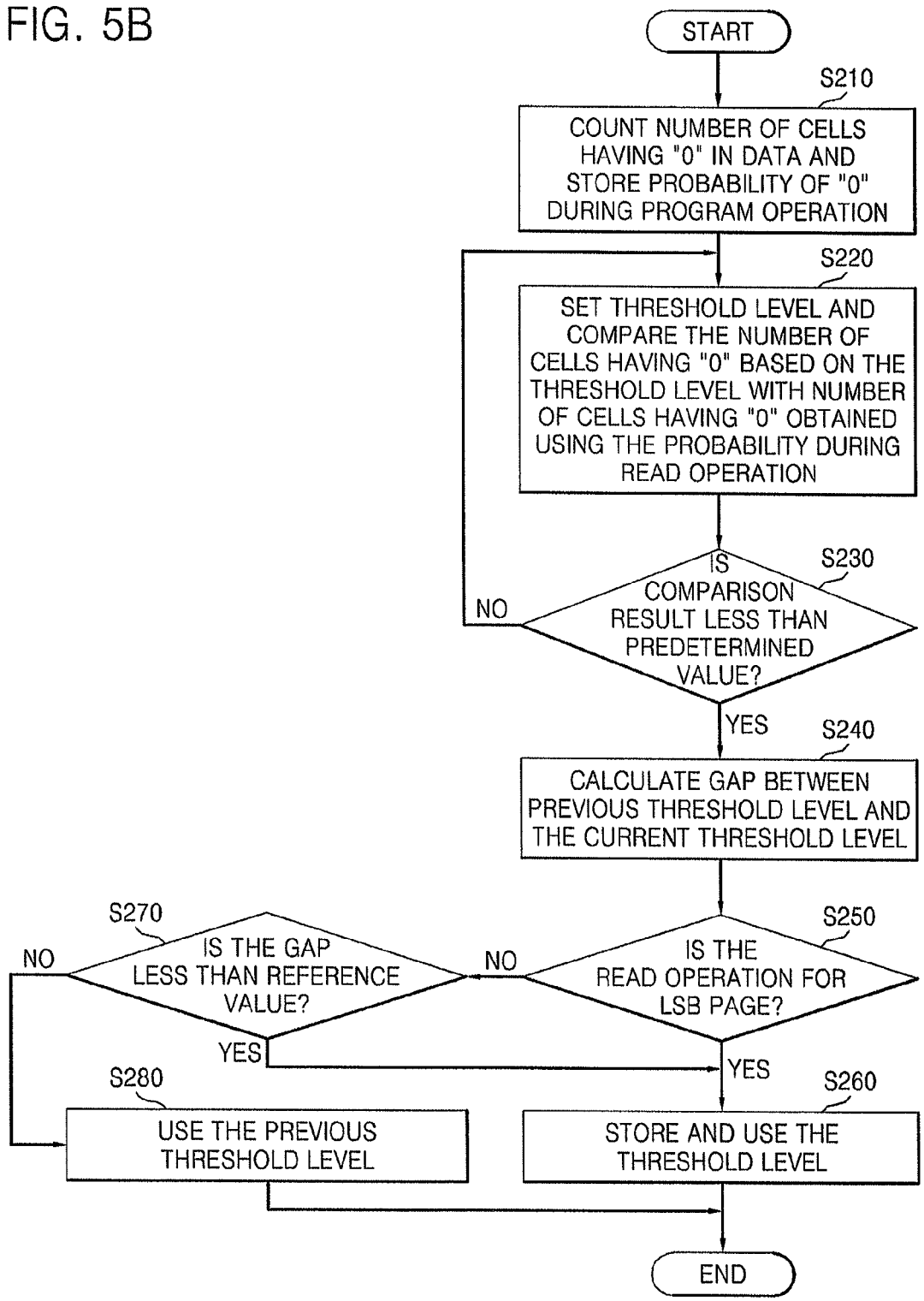
FIG. 5B illustrates a flowchart of a method of estimating a read level according to other embodiments.

FIG. 5B illustrates a flowchart of a method of estimating a read level according to other embodiments. The method illustrated in FIG. 5B may be performed by the non-volatile memory system 100 illustrated in FIGS. 1A and 1B.

Referring to FIG. 5B, during a program operation of the non-volatile memory device 120, the counter 1143 counts the number of cells having a bit of "0" in data to be programmed and stores a probability of the bit of "0" in the spare area 232 or a buffer (not shown) within the memory controller 110 in operation S210. Alternatively, the counter 1143 may count the number of cells having a bit of "1" instead of the number of cells having the bit of "0" and the number of cells instead of the probability may be stored.

Thereafter, during the read operation of the non-volatile memory device 120, a threshold level is set and the number of cells having the bit of "0" based on the threshold level is compared with the number of cells obtained using the probability of the bit of "0" stored in the spare area 232 using the comparator 1141 in operation S220. When a comparison result is determined to be less than a predetermined value in operation S230, a gap between a previous threshold level and the current threshold level is calculated in operation S240. Here, the previous threshold level has been set to perform a previous read operation and has been stored in the spare area 232 or the buffer within the memory controller 110.

It is determined whether the read operation is for an LSB page in operation S250. When it is determined that the read operation is for the LSB page, the read operation is performed using the current threshold level in operation S260. When it is determined that the read operation is not for the LSB page, it is determined whether the gap calculated in operation S240 is less than a reference value in operation S270. When it is determined that the gap is less than the reference value, the read operation is performed using the current threshold level in operation S260. When it is determined that the gap is not less than the reference value, the read operation is performed using the previous threshold level in operation S280.

Figure 6:
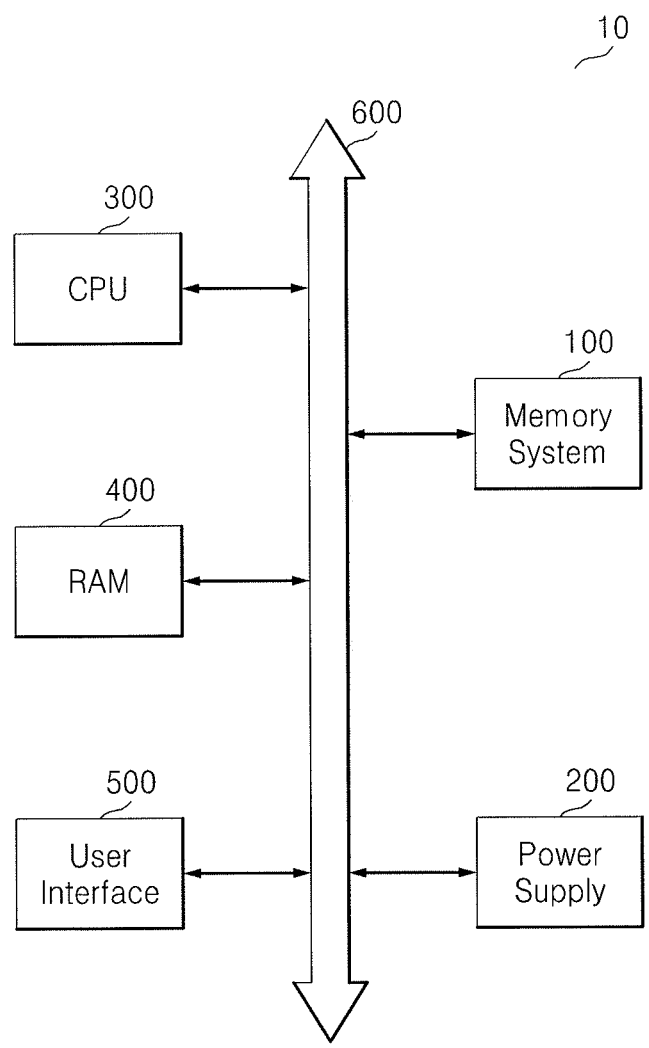
FIG. 6 illustrates a block diagram of an electronic system according to some embodiments.

FIG. 6 illustrates a block diagram of an electronic system 10 according to some embodiments. The electronic system 10 may be installed in systems such as mobile equipment, notebook computers, desktop computers, and so forth. The electronic system 10 includes the non-volatile memory system 100, a power supply 200, a central processing unit (CPU) 300, a random access memory (RAM) 400, a user interface 500, and a system bus 600 electrically connecting the other elements 100 through 500 with one another.

The CPU 300 controls the overall operation of the electronic system 10. The RAM 400 stores information necessary for the operation of the electronic system 10. The user interface 500 provides interface between the electronic system 10 and a user. The power supply 200 supplies electric power to the internal elements, i.e., the CPU 300, the RAM 400, the user interface 500, and the non-volatile memory system 100. Since the structure and the operations of the non-volatile memory system 100 have been described with reference to FIGS. 1A and 1B, the descriptions thereof will be omitted here to avoid redundancy.

Although not shown, the electronic system 10 may also include an application chipset, a camera image processor (CIS), and a mobile dynamic random access memory (DRAM). This will be apparent to those of ordinary skill in the art.

Figure 7A:
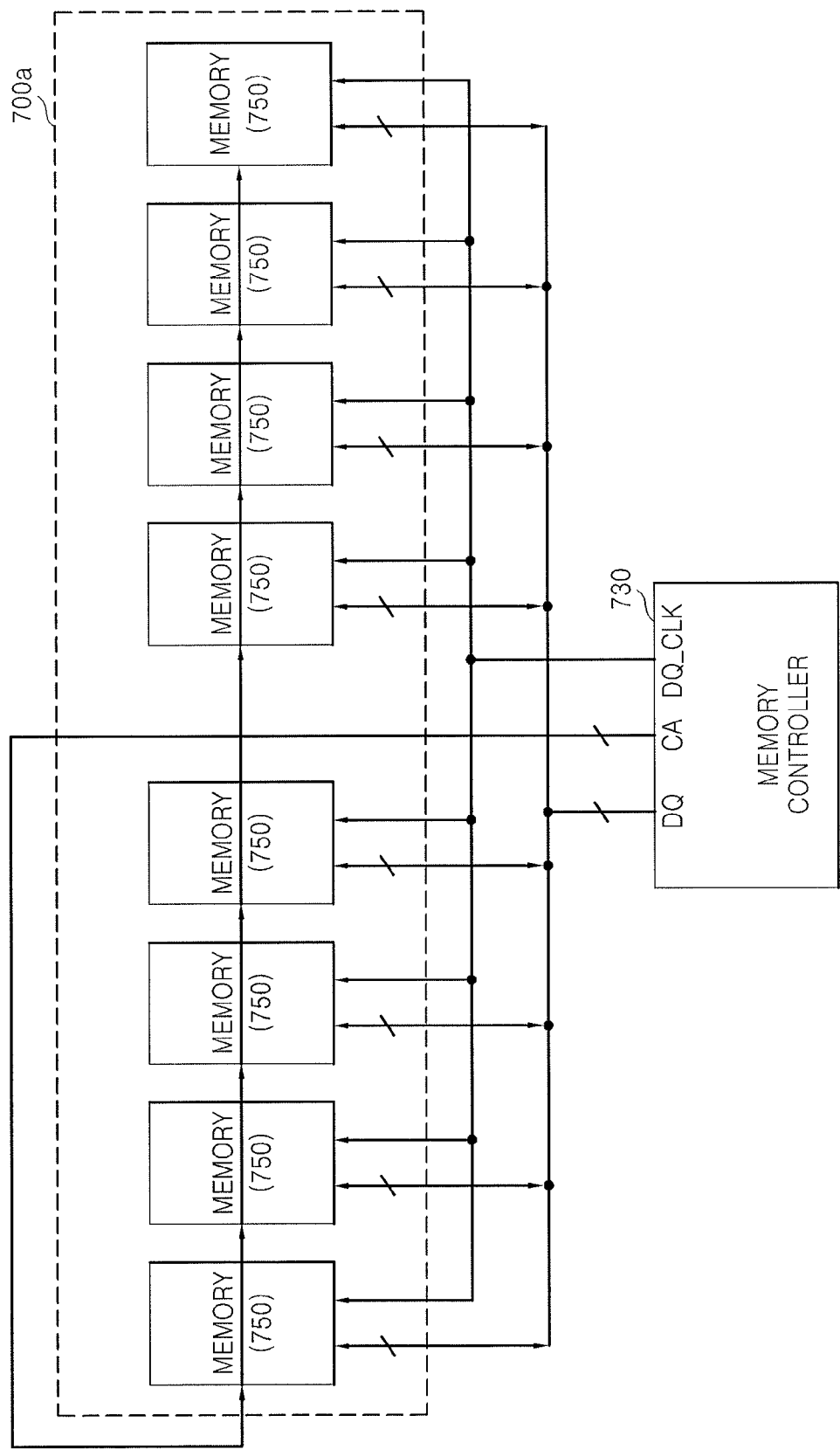
FIG. 7A through 7C illustrate block diagrams of memory modules according to some embodiments.
Figure 7B:
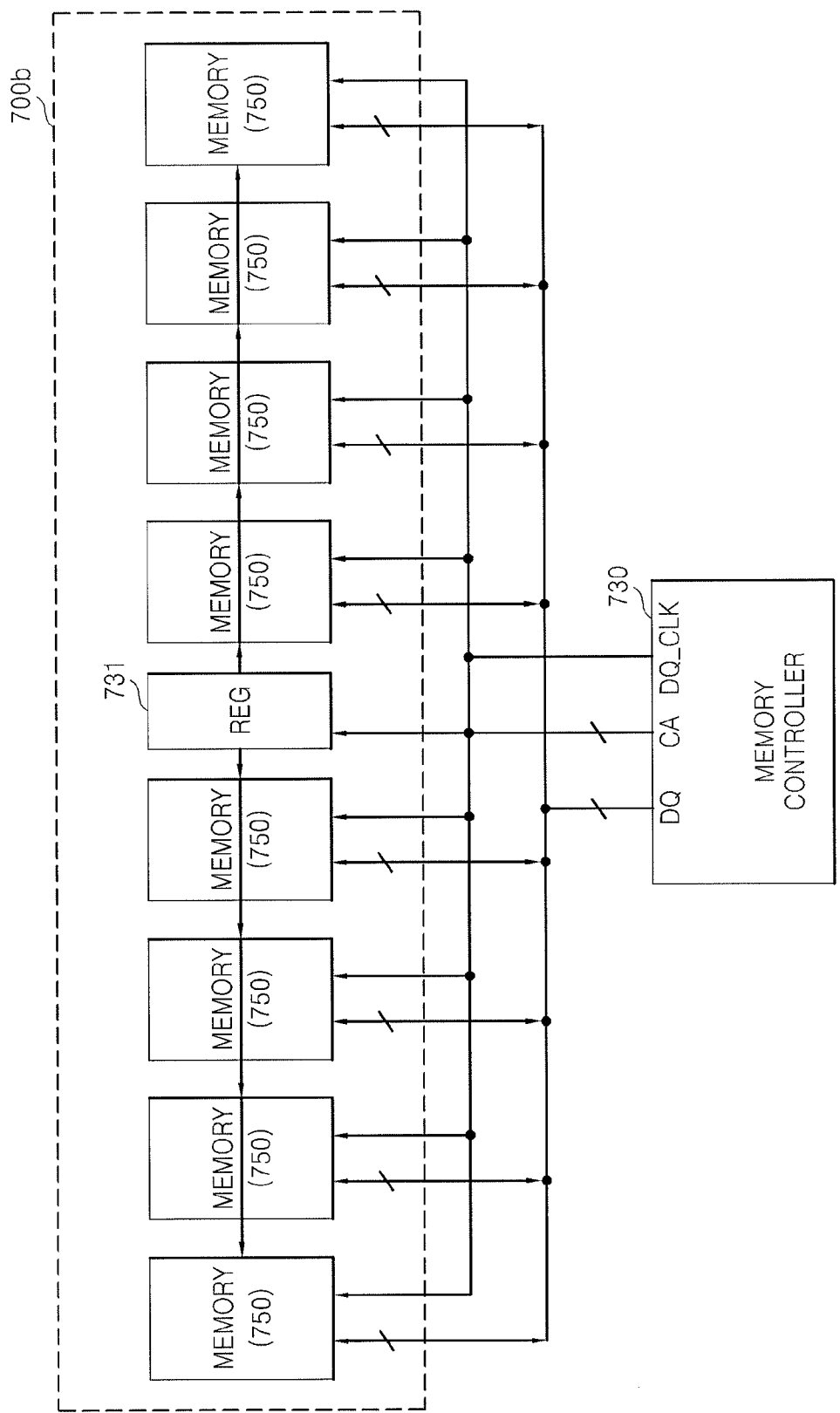
Figure 7C:
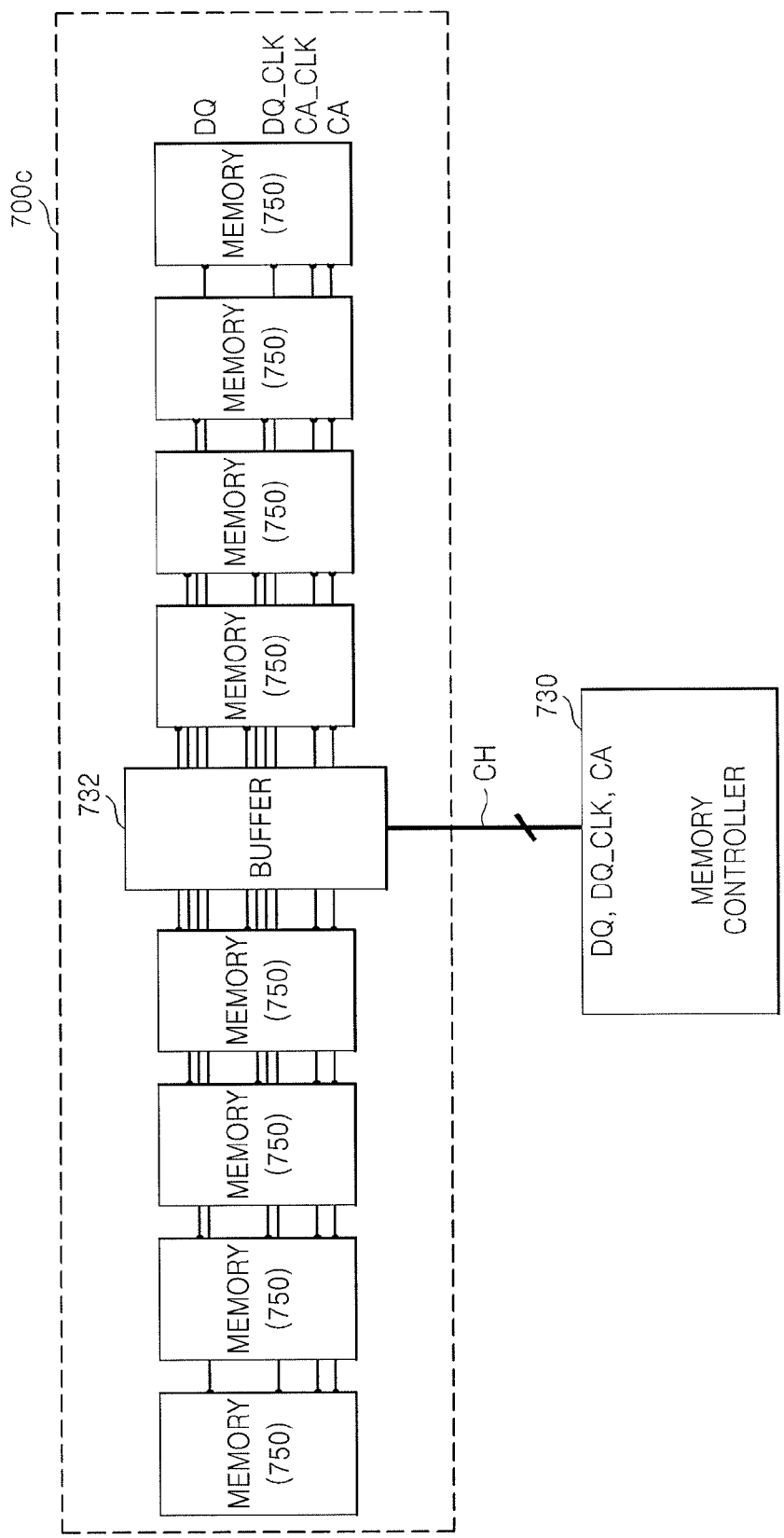

FIG. 7A through 7C are block diagrams of memory modules 700a, 700b, and 700c according to some embodiments.

The memory module 700a illustrated in FIG. 7A is an example of an unbuffered dual in-line memory module (UDIMM). The memory module 700a includes a plurality of semiconductor memory devices 750 which receive a command/address signal CA from a memory controller 730 and input or output data DQ in response to a clock signal DQ_CLK. The memory module 700a may also include a data wiring through which the data DQ is input to or output from the semiconductor memory devices 750, a command/address wiring through which the command/address signal CA is transferred to the semiconductor memory devices 750, and a clock wiring through which the clock signal DQ_CLK is provided to the semiconductor memory devices 750.

The clock signal DQ_CLK, the command/address signal CA, and the data DQ are input from the memory controller 730 to the memory devices 750 of the memory module 700a without passing through a separate buffer.

The memory module 700b illustrated in FIG. 7B is an example of a registered dual in-line memory module (RDIMM). While the command/address signal CA is input to the memory devices 750 of the memory module 700b via a register circuit 731, the clock signal DQ_CLK and the data DQ are input to the memory devices 750 without passing through the register circuit 731. The register circuit 731 may include a register for buffering the command/address signal CA. The register circuit 731 may be implemented on a chipset instead of the memory module 700b. In this case, the register circuit 731 may be removed from the memory module 700b.

The memory module 700c illustrated in FIG. 7C is an example of a fully buffered dual in-line memory module (FBDIMM) including a buffer 732. The memory module 700c including the buffer 732 is connected with an external device, i.e., the memory controller 730 using a single channel CH and can communicate with the external device through only the buffer 732 connected to the channel CH. In other words, all of the semiconductor memory devices 750 included in the memory module 700c receive the clock signal DQ_CLK, the command/address signal CA, and the data DQ from the memory controller 730 only through the buffer 732 connected to the channel CH and output the data DQ only through the buffer 732.

An exemplary embodiment of the present inventive concept may be implemented in hardware, software, or combination thereof. In case that an exemplary embodiment of the present inventive concept is implemented in software, a program including a plurality of subroutine codes for executing the method of estimating a read level for a non-volatile memory device may be stored in a tangible, non-transitory recording medium (e.g., the non-volatile memory device 120). The memory controller 110 may execute the method of estimating a read level for a non-volatile memory device by executing the plurality of subroutine codes stored in the non-volatile memory device.

By way of summation and review, according to some embodiments, a data input/output time is reduced, ensuring speed performance, and cell overhead and a BER is minimized. In accordance with embodiments, by examining a subset of programmed data, speed and performance may be balanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of estimating a read level for a memory device, the method comprising:
    calculating a first information corresponding to at least one of information about a number of cells in the memory device having a particular logic level in data to be programmed and information about a number of cells having a particular cell state;
    storing the first information during a program operation;
    reading the data based on a threshold level that has been set, the threshold level defining at least one first state for cells having a voltage above the threshold level and at least one second state for cells having a voltage below the threshold level;
    calculating a second information about a number of cells in at least one state of the at least one first state and the at least one second state defined by the threshold level with respect to the read data;
    calculating a third information about a number of cells in the at least one state using a probability based on the first information;
    comparing the second information with the third information; and
    determining whether to change the threshold level according to a comparison result.

2. The method as claimed in claim 1, wherein:
    the particular cell state comprises at least one state among states of a multi-level cell storing multiple bits;
    the first information is a number of multi-level cells in which a particular bit between a least significant bit and a most significant bit has a first logic level;
    the second information is a number of multi-level cells in the particular cell state based on the threshold level; and
    the third information is a number of multi-level cells in the particular cell state calculated using the probability.

3. The method as claimed in claim 1, wherein the first information is stored in a spare area of the memory device or a buffer within a memory controller.

4. The method as claimed in claim 1, wherein determining whether to change the threshold level comprises determining whether to change the threshold level according to a difference between the second information and the third information obtained as the comparison result.

5. The method as claimed in claim 4, further comprising:
    maintaining the threshold level when the difference between the second information and the third information is less than or equal to a predetermined value; and
    setting a new threshold level and repeating reading the data through comparing the second information and the third information when the difference between the second information and the third information exceeds or equals the predetermined value.

6. The method as claimed in claim 4, further comprising:
    storing the threshold level when the difference between the second information and the third information is less than a predetermined value.

7. The method as claimed in claim 6, further comprising:
    comparing a gap between a previous threshold level and a current threshold level with a reference value when the difference between the second information and the third information is less than the predetermined value.

8. The method as claimed in claim 7, further comprising:
using the previous threshold level when the gap between the previous threshold level and the current threshold level is greater than or equal to the reference value; and
storing and using the current threshold level when the gap between the previous threshold level and the current threshold level is less than the reference value.

9. A tangible, non-transitory recording medium for storing a program for executing the method as claimed in claim 1.

10. A memory controller for controlling a memory device, the memory controller comprising:
a control module configured to set a threshold level and control the memory device;
an information calculator connected with the control module, the information calculator being configured to calculate a first information corresponding to at least one of information about a number of cells in the memory device having a particular logic level in data to be programmed and information about a number of cells having a particular cell state, to calculate a second information about the number of cells in at least one state defined by the threshold level with respect to data read based on the threshold level, the threshold level defining at least one first state for cells having a voltage above the threshold level and at least one second state for cells having a voltage below the threshold level, and to calculate a third information about the number of cells in the at least one state of the at least one first state and the least one second state using a probability based on the first information; and
a comparator connected with the control module and the information calculator, the comparator configured to compare the second information with the third information.

11. The memory controller as claimed in claim 10, wherein the control module determines whether to change the threshold level according to a difference between the second information and the third information obtained as a comparison result of the comparator.

12. The memory controller as claimed in claim 11, further comprising a buffer configured to store the first information.

13. The memory controller as claimed in claim 12, wherein the control module stores the threshold level in the buffer when the difference between the second information and the third information is less than a predetermined value.

14. The memory controller as claimed in claim 10, wherein:
when a first state is one of states in which a multi-level cell storing multiple bits can be, the first information, second information, and the third information is the number of multi-level cells in the first state or a value calculated using the number of multi-level cells in the first state; and
when the first state is one between a first logic level and a second logic level, the first information, second information, and the third information is the number of bits in the first state or a value calculated using the number of bits in the first state.

15. The memory controller as claimed in claim 11, wherein the control module changes the threshold level and resets a new threshold level when the difference between the second information and the third information exceeds or equals a predetermined value.

16. The memory controller as claimed in claim 11, wherein the control module compares a gap between a previous threshold level with a current threshold level with a reference value when the difference between the second information and the third information is less than a predetermined value.

17. The memory controller as claimed in claim 16, wherein the control module uses the previous threshold level when the gap between the previous threshold level and the current threshold level is greater than or equal to the reference value and stores and uses the current threshold level when the gap is less than the reference value.

18. A memory system, comprising:
a memory device; and
the memory controller as claimed in claim 10.

19. The memory system as claimed in claim 18, wherein the memory controller stores the threshold level in a spare area in the memory device when the difference between the second information and the third information is less than the predetermined value.

20. A method of estimating a read level for a memory device, the method comprising:
calculating a first number of cells to be programmed with a particular subset of data in cells in the memory device;
storing the first number of cells during a program operation;
reading the data based on a threshold level that has been set, the threshold level defining at least one first state for cells having a voltage above the threshold level and at least one second state for cells having a voltage below the threshold level;
calculating a second number of cells in at least one state of the at least one first state and the at least one second state defined by the threshold level with respect to the read data;
calculating a third number of cells in the at least one state using a probability based on the first number of cells;
comparing the second number of cells with the third number of cells; and
determining whether to change the threshold level according to a comparison result.

* * * * *